(12) United States Patent
Fang et al.

(10) Patent No.: US 11,257,675 B2
(45) Date of Patent: Feb. 22, 2022

(54) TILTED IMPLANT FOR POLY RESISTORS

(71) Applicant: Cypress Semiconductor Corporation, San Jose, CA (US)

(72) Inventors: Shenqing Fang, Sunnyvale, CA (US); Timothy Thurgate, Sunnyvale, CA (US); Kuo Tung Chang, Saratoga, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 16/453,636

(22) Filed: Jun. 26, 2019

(65) Prior Publication Data
US 2019/0385853 A1    Dec. 19, 2019

Related U.S. Application Data

(63) Continuation of application No. 14/278,114, filed on May 15, 2014, now abandoned.

(51) Int. Cl.
| | | |
|---|---|---|
| *H01L 21/26* | (2006.01) | |
| *H01L 21/265* | (2006.01) | |
| *H01L 29/8605* | (2006.01) | |
| *H01L 49/02* | (2006.01) | |

(52) U.S. Cl.
CPC .. *H01L 21/26586* (2013.01); *H01L 21/26513* (2013.01); *H01L 28/20* (2013.01); *H01L 29/8605* (2013.01)

(58) Field of Classification Search
CPC .......................... H01L 21/26586; H01L 28/20
USPC ........................................................ 257/538
See application file for complete search history.

(56) References Cited

U.S. PATENT DOCUMENTS

| | | |
|---|---|---|
| 4,417,385 A | 11/1983 | Temple |
| 5,270,226 A | 12/1993 | Hori et al. |
| 5,504,023 A | 4/1996 | Hong |
| 5,581,105 A | 12/1996 | Huang |
| 5,937,289 A | 8/1999 | Bronner et al. |
| 6,255,175 B1 | 7/2001 | Yu |
| 6,743,685 B1 | 6/2004 | Wu et al. |
| 2002/0084496 A1 | 7/2002 | Chatani |
| 2003/0013226 A1* | 1/2003 | Shimizu ............ H01L 21/32155 438/100 |

(Continued)

OTHER PUBLICATIONS

USPTO Advisory Action for U.S. Appl. No. 14/278,114 dated Jun. 25, 2018; 6 pages.

(Continued)

*Primary Examiner* — Lex H Malsawma
*Assistant Examiner* — Laura M Dykes

(57) ABSTRACT

A semiconductor device having a substrate, a dielectric layer, a polycrystalline silicon ("poly") resistor, a drain, and a source is disclosed. After implantation, the poly resistor may have a lateral doping profile with two peaks, one near each edge of the poly resistor, and a trough near the middle of the poly resistor. Such a doping profile can allow the poly resistor to have a resistance that is insensitive to small variations in critical dimension of the poly resistor. The resistance of the poly resistor may be determined by the doping dose of the tilted implant used to form the poly resistor. The tilted implant may be used to form the drain and the source of a transistor substantially simultaneously as forming the poly resistor.

15 Claims, 6 Drawing Sheets

(56) References Cited

U.S. PATENT DOCUMENTS

| | | | |
|---|---|---|---|
| 2007/0257327 A1 | 11/2007 | Schiml et al. | |
| 2013/0049168 A1* | 2/2013 | Yang | H01L 27/0629 257/538 |
| 2013/0119480 A1* | 5/2013 | Wong | H01L 21/26506 257/380 |
| 2015/0069522 A1 | 3/2015 | Zhang | |
| 2015/0333188 A1* | 11/2015 | Fang | H01L 21/26586 257/538 |

OTHER PUBLICATIONS

USPTO Advisory Action for U.S. Appl. No. 14/278,114 dated Jul. 3, 2017; 3 pages.
USPTO Advisory Action for U.S. Appl. No. 14/278,114 dated Oct. 13, 2016; 3 pages.
USPTO Advisory Action for U.S. Appl. No. 14/278,114 dated Nov. 15, 2016; 3 pages.
USPTO Advisory Action for U.S. Appl. No. 14/278,114 dated Dec. 15, 2015; 3 pages.
USPTO Final Rejection for U.S. Appl. No. 14/278,114 dated Mar. 5, 2019; 22 pages.
USPTO Final Rejection for U.S. Appl. No. 14/278,114 dated Mar. 7, 2018; 22 pages.
USPTO Final Rejection for U.S. Appl. No. 14/278,114 dated Apr. 18, 2017; 17 pages.
USPTO Final Rejection for U.S. Appl. No. 14/278,114 dated Aug. 25, 2016; 14 pages.
USPTO Final Rejection for U.S. Appl. No. 14/278,114 dated Oct. 20, 2015; 10 pages.
USPTO Non Final Rejection for U.S. Appl. No. 14/278,114 dated Sep. 20, 2018; 19 pages.
USPTO Non-Final Rejection for U.S. Appl. No. 14/278,114 dated Feb. 22, 2016; 14 pages.
USPTO Non-Final Rejection for U.S. Appl. No. 14/278,114 dated Jun. 17, 2015; 11 pages.
USPTO Non-Final Rejection for U.S. Appl. No. 14/278,114 dated Sep. 15, 2017; 16 pages.
USPTO Non-Final Rejection for U.S. Appl. No. 14/278,114 dated Dec. 28, 2016; 13 pages.
USPTO Restriction Requirement for U.S. Appl. No. 14/278,114 dated May 1, 2015; 7 pages.

* cited by examiner

TILTED IMPLANT FOR POLY RESISTORS

CROSS-REFERENCE TO RELATED APPLICATION

The present application is a continuation application of U.S. Non-Provisional application Ser. No. 14/278,114, filed on May 15, 2014, which is incorporated herein by reference in its entirety.

BACKGROUND

Technical Field

This disclosure relates generally to improved semiconductor devices and methods for making such devices.

Related Art

In integrated circuit design, polycrystalline silicon ("poly") resistors having sheet resistances greater than or equal to 10 kilo-ohms/square (kΩ/sq) and very low tolerances (i.e., very little variations in resistance) are sometimes required. During the fabrication process of an integrated circuit, poly resistors are formed by doping poly layers. For the poly resistors to have the required sheet resistances, an implant with an appropriate doping dose needs to be used. In conventional manufacturing processes, the tolerance in resistance is highly dependent on variations in the critical dimension of the poly layer.

Thus, what is needed are semiconductor devices and methods for manufacturing them wherein poly resistors are insensitive to variations in their critical dimensions and can be formed using conventional manufacturing processes.

BRIEF SUMMARY OF THE INVENTION

According to various embodiments, a method of manufacturing an integrated circuit device and its resulting structure are described. According to an example method, a dielectric layer is formed on a substrate. A polycrystalline silicon ("poly") layer may be formed over the dielectric layer, followed by the formation of a masking layer over the poly layer. The dielectric layer, poly layer and masking layer may be etched. A tilted implant may be used to dope the sidewalls of the poly layer may be doped by the tilted implant, forming a poly resistor. Substantially simultaneously as forming the poly resistor, the exposed portions of the substrate may be doped to form a drain and a source of a transistor.

A semiconductor device is also described. The semiconductor device may include a substrate, a dielectric layer, a poly resistor, a drain and a source. After implantation, the poly resistor may have a lateral doping profile with two peaks, one near each edge of the poly resistor, and a trough near the middle of the poly resistor. Such a doping profile can allow the poly resistor to have a resistance that is insensitive to variation in critical dimension of the poly resistor. The resistance of the poly resistor may be determined by the doping dose of the tilted implant used to form the poly resistor. The tilted implant may be used to form the drain and the source of a transistor substantially simultaneously as forming the poly resistor.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS/FIGURES

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

Figure 1:
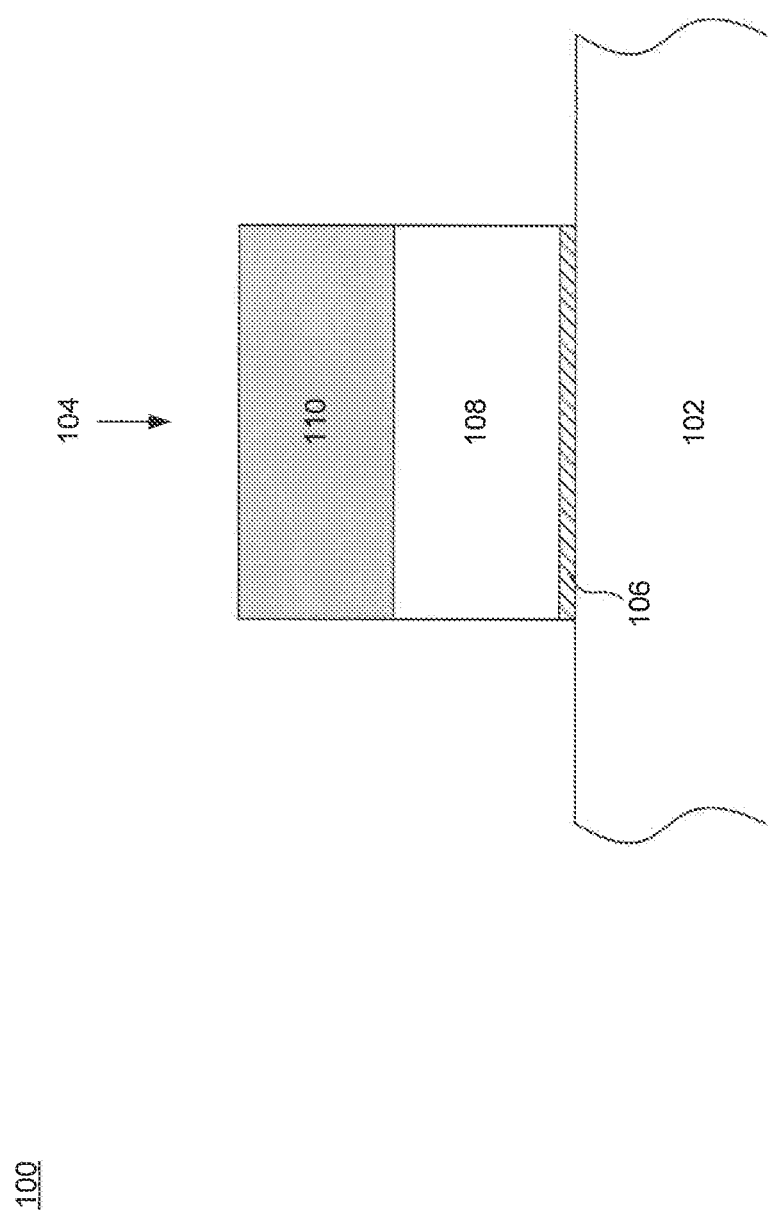
FIG. 1 depicts a cross-section of a semiconductor device according to an embodiment.

The features and advantages of embodiments of the present invention will become more apparent from the detailed description set forth below when taken in conjunction with the drawings. In the drawings, like reference numbers generally indicate identical, functionally similar, and/or structurally similar elements.

DETAILED DESCRIPTION OF THE INVENTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

According to certain embodiments, when etching a material, at least a portion of the material remains behind after the etching process is completed. In contrast, when removing a material, all or substantially all of the material is removed in the removal process.

In the teachings contained herein, various regions of a substrate upon which devices are fabricated are mentioned. It should be understood that these regions may exist anywhere on the substrate and furthermore that the regions may not be mutually exclusive. That is, in some embodiments, portions of one or more regions may overlap. It should be understood that any number of regions may exist on the substrate and may designate areas having certain types of devices or materials. In general, the regions are used to conveniently describe areas of the substrate that include similar devices and should not limit the scope or spirit of the described embodiments.

In embodiments, the terms "forming," "form," "deposit," or "dispose" refer to the act of applying a layer of material to the substrate or another layer of material. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

In embodiments, the term "substrate" refers to silicon. However, the substrate may also be any of a wide array of semiconductor materials such as germanium, gallium arsenide, indium phosphide, etc. In other embodiments, the substrate may be electrically non-conductive such as a glass or sapphire wafer.

In embodiments, "mask" may comprise any appropriate material that allows for selective removal (or etching) of an unmasked portion a material. According to some embodiments, masking structures may comprise a photoresist such as Poly(methyl methacrylate) (PMMA), Poly(methyl glutarimide) (PMGI), a Phenol formaldehyde resin, a suitable epoxy, etc.

An example method for manufacturing a semiconductor device with a polycrystalline silicon ("poly") will now be described with respect to FIGS. 1-3, which depict cross-sections of a semiconductor device 100 at various stages during production. In FIG. 1, semiconductor device 100 is depicted as having a substrate 102. A stack 104 has been formed on top of substrate 102 according to a number of known methods. The present disclosure is not limited to any particular method of producing stack 104. Indeed the spirit and scope of the invention includes any appropriate method for forming stack 104. As can be seen in FIG. 1, stack 104 includes, over the substrate 102, a dielectric layer 106, such as, but not limited to, silicon dioxide ("oxide"). A poly layer 108 has been disposed over dielectric layer 106. A masking layer 110, such as, but not limited to, silicon nitride ("nitride"), has been disposed over poly layer 108.

Figure 2:
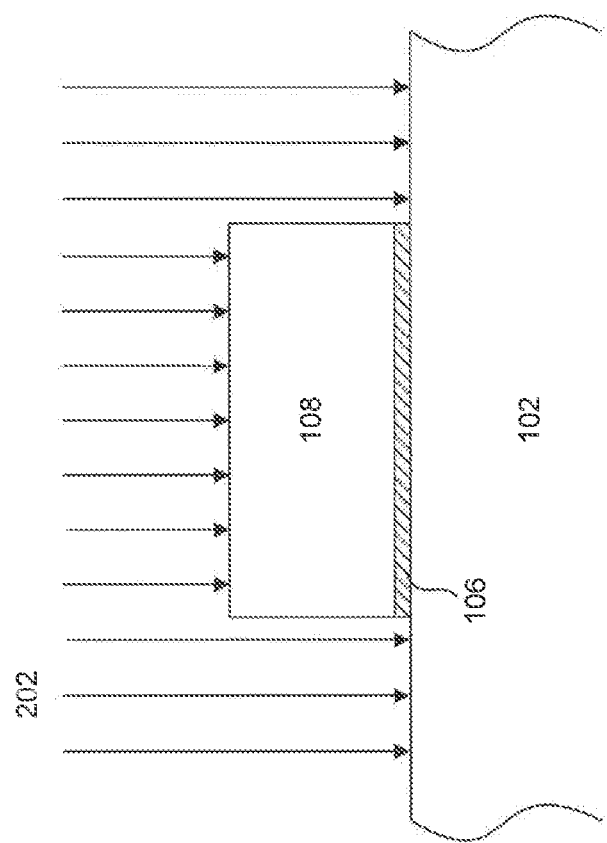
FIG. 2 depicts a cross-section of a semiconductor device being doped according to an embodiment.

According to an embodiment, FIG. 2 depicts semiconductor device 100 at a later point in the production process, where masking layer 110 has been removed, for example by etching. Subsequently, substrate 102 and poly layer 108 are exposed to an implantation process 202 that is perpendicular to the surface of substrate 102 and the top surface of the poly. It is to be appreciated that, in some embodiments, additional masking and etching stages may be conducted to selectively implant poly 108 while preventing substrate 102 from being implanted. After such a perpendicular implantation, the lateral doping concentration within poly 108 is uniform. Consequently, the resistance of poly 108 is highly dependent on its critical dimension.

Figure 3:
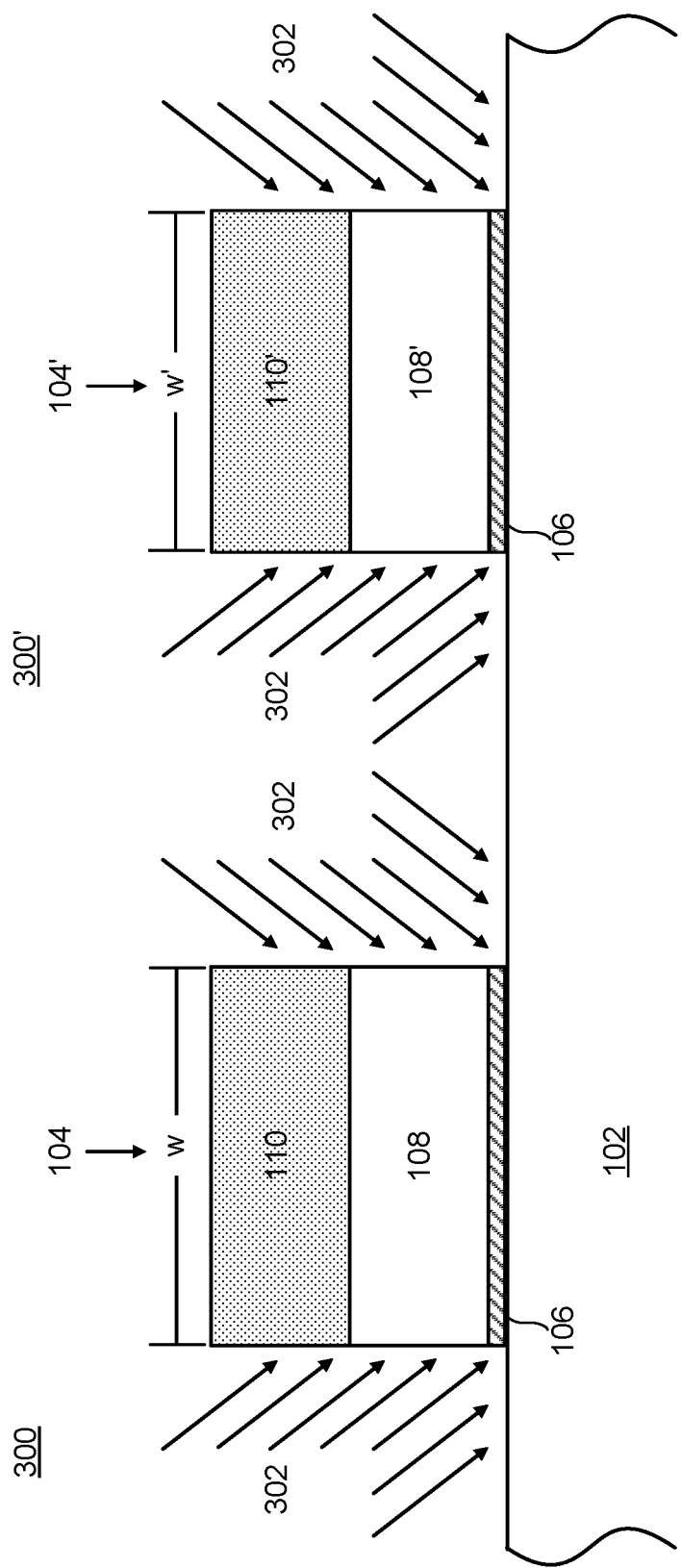
FIG. 3 depicts a cross-section of a semiconductor device being doped according to an embodiment.

According to another embodiment, FIG. 3 depicts devices 300, 300' at a later point in the production process, where substrate 102 and stacks 104, 104' are exposed to a tilted implantation process 302. For example, tilted implantation process 302 may comprise, but is not limited to, four rotations of p-type boron or boron fluoride ions at a tilt angle of 35 degrees and a doping dose of greater than or equal to $8 \times 10^{13}$ ions/cm$^2$. For boron ions, the doping energy level may be greater than or equal to 10 keV. For boron fluoride ions, the doping energy level may be greater than or equal to 60 keV. In yet another example, the tilted implantation process may be a lightly doped drain (LDD) implantation process where, for example, a lightly doped drain implant is used. As can be seen in FIG. 3, unlike implantation process 202 in FIG. 2, tilted implantation process 302 allows ions to be implanted into the sidewalls of poly layers 108, 108' without the removal of masking layers 110, 110'. Additionally, substantially simultaneously, the ions are implanted into the exposed regions of substrate 102. Where the devices 300, 300' include poly resistors, after the implant the poly layers 108, 108' have a lateral doping profile that allows the poly resistors to have a resistance that is insensitive to variation in critical dimensions w, w' of the poly resistors.

Figure 4:
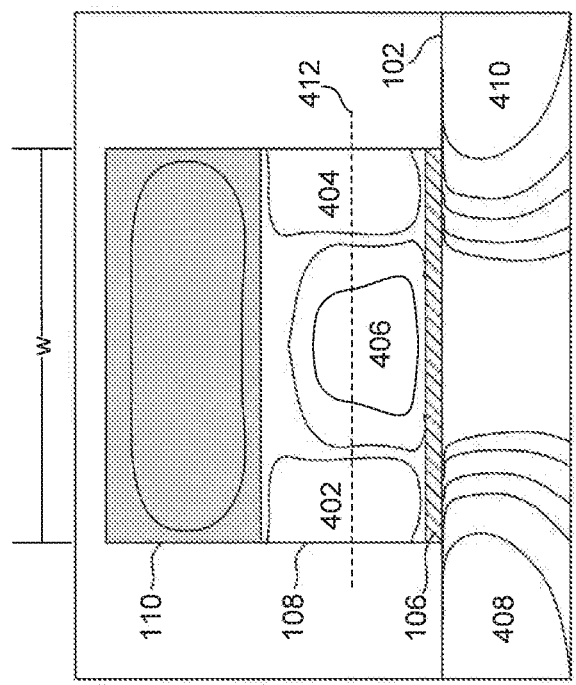
FIG. 4 depicts a cross-section of a semiconductor device with doping concentration contour lines according to an embodiment.

FIG. 4 depicts an exemplary result of the tilted implantation process. The contour lines illustrate cross-sectional doping concentration levels after implantation, in particular within substrate 102 and poly layer 108. In substrate 102, the doping concentration peaks where substrate 102 is exposed, in regions 408 and 410. One of regions 408 and 410 can eventually form a drain of a transistor, while the other can form source of the transistor, for example. In an embodiment, doped poly layer 108 will eventually form a poly resistor. In poly layer 108, the doping concentration after implantation is at a maximum close to each edge, in regions 402 and 404, and is at a minimum in region 406. An exemplary lateral doping concentration profile along line 412, across poly layer 108, is depicted in FIG. 5.

Figure 5:
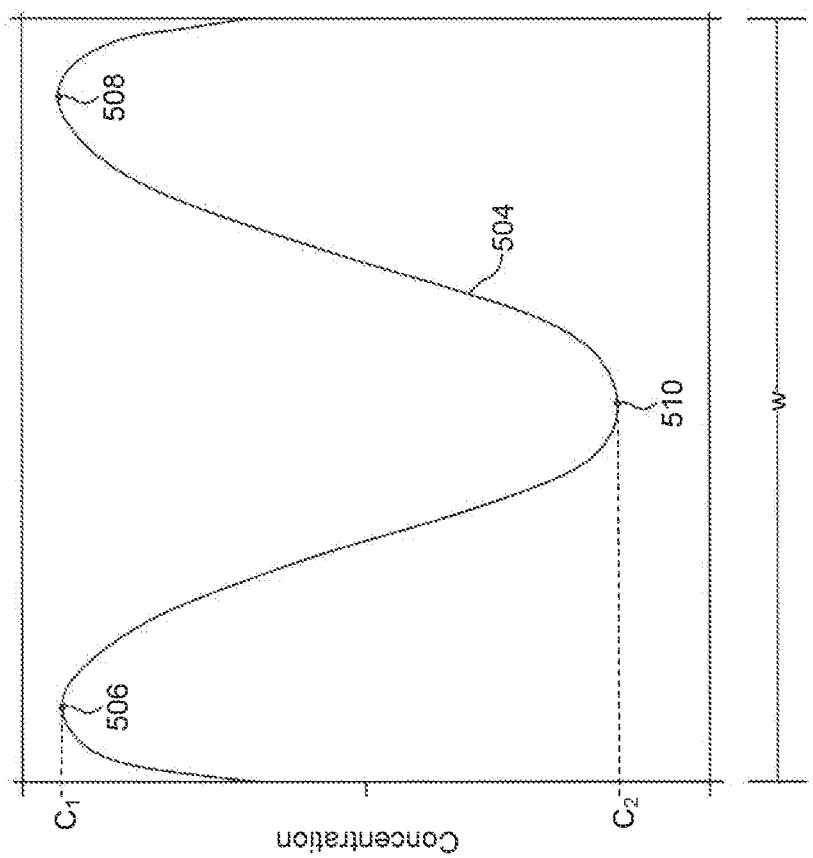
FIG. 5 depicts the doping concentration profile across a polycrystalline silicon ("poly") resistor of a semiconductor device according to an embodiment.

FIG. 5 shows, for example, a doping concentration 504, which is the number of ions, out of the total number of ions as implanted. As can be seen in FIG. 5, doping concentration 504 has two peaks at points 506 and 508, close to each edge of poly layer 108, and one trough at point 510. In an embodiment, as determined by desired implementation specifications, the doping concentration $C_1$ at points 506 and 508 can be, for example, 50 to 100 times greater than the doping concentration $C_2$ at point 510. Doping concentration 504 having two peaks near the edges of poly layer 108 indicates that the ions are concentrated near the edges. As a result, small variations in the critical dimension, shown as "w" on FIG. 5, of the poly layer 108 have negligible effect on the overall doping concentration and thus the subsequent resistance of the poly resistor. In other words, the resistance of the poly resistor is practically insensitive to small variations in its critical dimension. It is to be appreciated that, in an embodiment, although the dopants can spread out and the doping profile can become more uniform after annealing, the total number of ions in poly layer 108 and the resistance of the poly resistor remain unchanged. In an embodiment, critical dimension w is greater than or equal to 0.25 µm.

Figure 6:
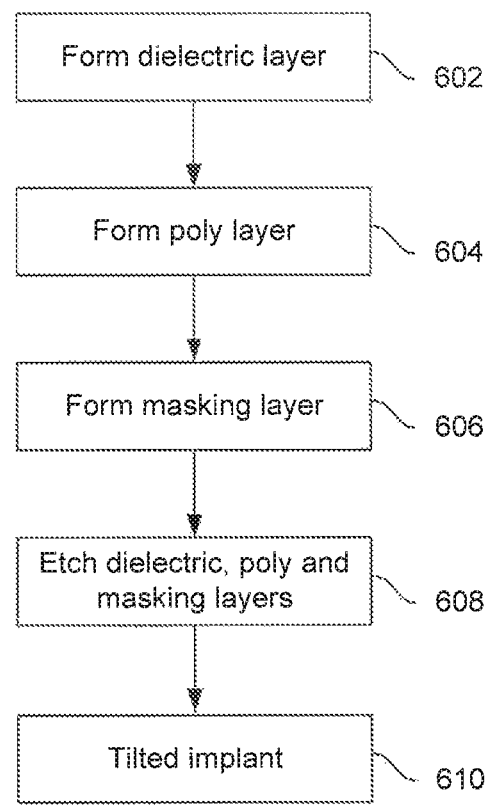
FIG. 6 is a flowchart of a method of manufacturing a semiconductor device with poly resistors according to various embodiments.

FIG. 6 depicts a method 600 of constructing a semiconductor device such as device 300 according to various embodiments. The discussion of FIG. 6 will make reference to FIG. 3, but it should be understood that method 600 is not limited to the specific embodiment depicted in FIG. 3, but is more generally applicable.

As shown in FIG. 6, method 600 begins at step 602 by forming a dielectric layer (e.g., dielectric layer 106) on a substrate 102. At step 604, poly layer 108 is formed over dielectric layer 106. At step 606, masking layer 110 is formed over poly layer 108. Portions of dielectric layer 106, poly layer 108 and masking layer 110 are etched at step 608. At step 610, a tilted implantation process 302 is used to dope the sidewalls of poly layer 108 and the exposed regions of substrate 102.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance. Additionally, it should be understood that none of the examples or explanations contained herein are meant to convey that the described embodiments have been actually reduced to practice.

The breadth and scope of the present invention should not be limited by any of the above-described exemplary embodiments, but should be defined only in accordance with the following claims and their equivalents.

What is claimed is:

1. A semiconductor resistor device, comprising:
a substrate;
a first poly resistor including a first doped poly layer formed over the substrate, wherein the first doped poly layer has a first critical dimension; and
a second poly resistor including a second doped poly layer formed over the substrate,
wherein the second doped poly layer has a second critical dimension;
wherein the first and second doped poly layers are formed using a same tilted implant on only two opposite sides that are perpendicular to a width of the first and second doped poly layers to achieve an approximately same resistance, and the first and second critical dimensions are different from one another, and wherein operation of the same titled implant results in the first and second doped poly layers having a lateral doping concentration profile with only two peaks, one near each of the two opposite sides first and second doped poly layers, and with a trough near a middle of the first and second doped poly layers.

2. The semiconductor resistor device of claim 1, wherein the first and second critical dimensions are each greater than or equal to 0.25 μm.

3. The semiconductor resistor device of claim 1, wherein the approximately same resistance of the first and second doped poly layers is determined by a doping dose of the same tilted implant, and insensitive to the first and second critical dimensions.

4. The semiconductor resistor device of claim 1, wherein the two peaks of the lateral doping concentration profile of the first and second doped poly layers have doping concentration that is 50 to 100 times greater than doping concentration of the trough.

5. The semiconductor resistor device of claim 1, wherein the first and second doped poly layers have an approximately same number of dopant ions.

6. The semiconductor resistor device of claim 5, wherein the dopant ions comprise p-type dopant ions.

7. The semiconductor resistor device of claim 5, wherein the dopant ions comprise n-type dopant ions.

8. A semiconductor resistor device, comprising:
a plurality of poly resistors disposed over a substrate, each poly resistor including a doped poly layer formed simultaneously by a titled implant of dopant ions on only two opposite sides that are perpendicular to a width of the doped poly layer,
wherein the doped layer of each poly resistor includes an approximately same number of dopant ions and resistance, and wherein the widths of at least two of the doped poly layers are significantly different from one another, and wherein each of the doped poly layers has a lateral doping concentration profile with only two peaks, one near each edge of the doped poly layers, and with a trough near a middle of the doped poly layers.

9. The semiconductor resistor device of claim 8, wherein the widths of the doped poly layers are each greater than or equal to 0.25 μm.

10. The semiconductor resistor device of claim 9, wherein the resistance of the doped poly layers is determined by operation of the dopant implant and insensitive to the widths of the doped poly layers.

11. The semiconductor resistor device of claim 8, wherein the two peaks of the lateral doping concentration profile of the doped poly layers have doping concentration that is 50 to 100 times greater than doping concentration of the trough.

12. The semiconductor resistor device of claim 8, wherein the dopant ions comprise p-type dopant ions.

13. The semiconductor resistor device of claim 8, wherein the dopant ions comprise n-type dopant ions.

14. A semiconductor device comprising:
a doped poly layer on a surface of a substrate, the doped poly layer including:
a first poly resistor having a first width in a first direction;
a second poly resistor having a second width in the first direction different from the first width of the first poly resistor,
wherein each of the first poly resistor and the second poly resistor comprise a lateral doping concentration profile with two peaks, one near each edge of opposite sides that are perpendicular to the first direction.

15. The semiconductor device of claim 14, wherein the first poly resistor and the second poly resistor comprise a resistance insensitive to the difference between the first width and the second width.

* * * * *